United States Patent
Look

(10) Patent No.: US 7,092,273 B2
(45) Date of Patent: Aug. 15, 2006

(54) LOW VOLTAGE NON-VOLATILE MEMORY TRANSISTOR

(75) Inventor: Kevin T. Look, Fremont, CA (US)

(73) Assignee: Xilinx Inc., San Jose, CA (US)

( * ) Notice: Subject to any disclaimer, the term of this patent is extended or adjusted under 35 U.S.C. 154(b) by 0 days.

(21) Appl. No.: 11/353,824

(22) Filed: Feb. 14, 2006

(65) Prior Publication Data

US 2006/0134839 A1  Jun. 22, 2006

Related U.S. Application Data

(62) Division of application No. 10/706,115, filed on Nov. 12, 2003.

(51) Int. Cl.
*G11C 17/14* (2006.01)

(52) U.S. Cl. ............... 365/104; 438/132; 438/281; 438/467; 257/413; 257/529; 257/757; 257/904; 365/96; 365/177; 365/184

(58) Field of Classification Search ............... 438/467, 438/132, 281; 257/413, 529, 757, 904; 365/96, 365/104, 177, 184
See application file for complete search history.

(56) References Cited

U.S. PATENT DOCUMENTS

| | | | | |
|---|---|---|---|---|
| 4,219,836 A | * | 8/1980 | McElroy ............... | 257/390 |
| 4,238,839 A | * | 12/1980 | Redfern et al. ......... | 365/96 |
| 4,647,340 A | * | 3/1987 | Szluk et al. ............ | 438/281 |
| 4,872,140 A | * | 10/1989 | Graham et al. .......... | 365/96 |
| 5,166,758 A | * | 11/1992 | Ovshinsky et al. ...... | 257/3 |
| 6,060,743 A | * | 5/2000 | Sugiyama et al. ....... | 257/321 |
| 6,258,700 B1 | * | 7/2001 | Bohr et al. ............ | 438/467 |
| 6,496,416 B1 | | 12/2002 | Look | |
| 6,525,397 B1 | * | 2/2003 | Kalnitsky et al. ....... | 257/529 |
| 6,671,205 B1 | | 12/2003 | Look | |
| 6,703,680 B1 | * | 3/2004 | Toyoshima ............. | 257/529 |
| 6,807,079 B1 | * | 10/2004 | Mei et al. ............. | 365/96 |
| 6,882,571 B1 | | 4/2005 | Look | |
| 6,911,360 B1 | * | 6/2005 | Li et al. .............. | 438/238 |
| 6,930,920 B1 | | 8/2005 | Look | |
| 6,936,527 B1 | | 8/2005 | Look | |

(Continued)

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

(Continued)

*Primary Examiner*—Bradley K. Smith
*Assistant Examiner*—Steven J. Fulk
(74) *Attorney, Agent, or Firm*—E. Eric Hoffman; Justin Liu

(57) ABSTRACT

A p-channel non-volatile memory (NVM) transistor is programmed by shifting the threshold voltage of the transistor. The threshold voltage is shifted by introducing a programming current to the gate electrode of the transistor, and simultaneously introducing a negative bias to the transistor. The threshold voltage of the p-channel NVM transistor is shifted in response to the negative bias condition and the heat generated by the programming current. The high temperature accelerates the threshold voltage shift. The threshold voltage shift is accompanied by an agglomeration of material in the gate electrode. The agglomeration of material in the gate electrode is an indication of the high temperature reached during programming. The threshold voltage shift of the p-channel NVM transistor is permanent.

9 Claims, 2 Drawing Sheets

U.S. PATENT DOCUMENTS

| | | | |
|---|---|---|---|
| 2003/0122200 A1* | 7/2003 | Kamiya et al. | 257/379 |
| 2004/0124458 A1* | 7/2004 | Kothandaraman | 257/300 |
| 2005/0067670 A1* | 3/2005 | Hui | 257/529 |

OTHER PUBLICATIONS

N. Kimizuka et al., "NBTI enchancement by nitrogen incorporation into ultrathin gat oxide for 0.10-um gate CMOS generation," 200 Symposium on VLSI Technology Digest of Technical Papers, Apr. 2000, pp. 92-93, IEEE, 3 Park Avenue, 17th Floor, New York, NY 10016-5997.

Jerome B. Lasky et al., "Comparison of Transformation to Low-Resistivity Phase and Agglomeration of TiSi and $CoSi_2$," IEEE Transactions on Electron Devices, vol. 38, No. 2, Feb. 1991, pp. 262-269, IEEE, 3 Park Avenue, 17th Floor, New York, NY 10016-5997.

Se-Augjang et al., "Effects of Thermal Processes After Silicidation on the Performance of $TiSi_2$/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Mohsen Alavi et al., A PROM Element Based on Salicide Agglomeration of Poly Fuses in a CMOS Logic Process, Jul. 1997, pp. 855-858, IEEE, 3 Park Avenue, 17th Floor, New York, NY 10016-5997.

Alexander Kalnitzky et al., $CoSi_2$ integrated fuses on poly silicon for low voltage 0.18um CMOS applications, Sep. 1999, pp. 765-768 IEEE, 3 Park Avenue, 17th Floor, New York, NY 10016-5997.

* cited by examiner

LOW VOLTAGE NON-VOLATILE MEMORY TRANSISTOR

This application is a divisional of application Ser. No. 10/706,115 filed Nov. 12, 2003.

FIELD OF THE INVENTION

The present invention relates to non-volatile memory transistors. More specifically, the present invention relates to a low-voltage non-volatile memory transistor that can be fabricated using a standard CMOS process.

RELATED ART

As semiconductor process technology advances, both vertical and horizontal dimensions of the resulting devices are scaled to smaller and smaller dimensions. The operating voltage of the resulting field effect transistors is also reduced to avoid a high electric field across the transistor gate oxide. However, the voltage required to turn the transistor on or off (hereinafter referred to as the threshold voltage), has not been scaled down as aggressively as the operating voltage. The difference between the operating voltage and the threshold voltage becomes smaller and smaller as semiconductor process technology progresses. In today's deep sub-micron technology (e.g., 90 nanometers (nm) or less), the operating voltage of the resulting device is reduced to about 1.0 Volt while the threshold voltage of the associated transistors remains at about 0.4 Volts. (i.e., the same threshold voltage associated with process technologies of 130 nm or greater). Certain operating conditions may undesirably shift the threshold voltage of the transistors close to the operating voltage, such that it is difficult to turn on the transistor.

The threshold voltages of P-channel transistors are known to degrade when exposed to a negative bias voltage at a high temperature. The temperature effect on a negative biased p-channel transistor is described by Yamamoto et al. in "Bias Temperature Instability in Scaled p+ Polysilicon Gate p-MOSFET's", IEEE Transactions on Electron Devices, Vol. 46, No. 5, May 1999, pp. 921–926. Yamamoto et al. indicates that the threshold voltage shift is an exponential function of the inverse of the temperature. Extrapolation from the data presented by Yamamoto et al. shows that the threshold voltage can shift by more than 1 Volt at temperatures over 500° C. Yamamoto et al. also indicates that the threshold voltage shift is dependent on the channel length of the transistor.

In "NBTI Enhancement by Nitrogen Incorporation into Ultrathin Gate Oxide for 0.10-um Gate CMOS Generation", 2000 Symposium on VLSI Technology Digest of Technical Papers, p. 93, Kimizuka et al. also reported that the lifetime of a p-channel transistor (i.e., change in threshold voltage) is an exponential function of the inverse of the temperature.

Titanium (Ti) polysilicide and cobalt (Co) polysilicide are commonly used materials for transistor gates and interconnects in integrated circuit manufacturing processes due to the low resistivity exhibited by these materials. The effect of the required anneal temperature on the resistivity of titanium silicide has been described by Lasky et al. in "Comparison of Transformation to Low-Resistivity Phase and Agglomeration of $TiSi_2$ and $CoSi_2$", IEEE Transactions on Electron Devices, Vol. 38, No. 2, February 1991, pp. 262–269. Lasky et al. teaches that the resistivity of titanium silicide is transformed from a low resistivity (5–15 Ohms/sq.) to a high resistivity (greater than 100 Ohms/sq.) at an anneal temperature greater than 950° C. Lasky et al. also attributes the agglomeration of the titanium silicide to the change in resistivity at these high temperatures.

The effect of the thermal process on the performance of a titanium silicide gate device has been described by Jang et al. in "Effects of Thermal Processes After Silicidation on the Performance of $TiSi_2$/Polysilicon Gate Device", IEEE Transactions on Electron Devices, Vol. 46, No. 12, December 1999, pp. 2353–2356. Jang et al. observes that the resistivity of a titanium silicide gate changes as the BPSG reflow temperature increases from 750° C. to 850° C.

In "A PROM Element Based on Salicide Agglomeration of Poly Fuses in a CMOS Logic Process", International Electron Devices Meeting (IEDM) Technical Digest, pp. 855–858, 1997, Alavi et al. describes a structure that can be programmed to change resistivity by passing current through a titanium silicide element in the structure, thereby causing agglomeration. The agglomeration is initiated with a low voltage (less than 2 Volts) and a moderate current (less than 10 mA). The change in resistivity is an indication that passing current through the titanium silicide structure generates enough heat to reach the critical temperature to start the agglomeration.

Similarly, a resistivity change in a cobalt silicide fuse structure has been demonstrated by Kalnitsky et al. in "$CoSi_2$ Integrated Fuses on Poly Silicon for Low Voltage 0.18 um CMOS Applications", International Electron Devices Meeting (IEDM) Technical Digest, pp. 765–768, 1999.

It would therefore be desirable to have a structure that takes advantage of (1) the P-channel transistor's threshold voltage instability at negative bias and high temperature and (2) the high temperature generation in the presence of current.

SUMMARY

Accordingly, the present invention provides a 5-terminal p-channel non-volatile memory (NVM) transistor that is programmed by shifting the threshold voltage of the transistor. The threshold voltage is shifted by introducing a programming current to the gate electrode of the transistor, and simultaneously introducing a negative bias to the transistor.

In accordance with one embodiment, the NVM transistor includes an n-type semiconductor body region, first and second p-type source/drain regions located in the semiconductor body region and separated by a channel region, and a polysilicon/metal polysilicide gate electrode having a central portion located over the channel region, a first end portion located on a one side of the central portion, and a second end portion located on an opposite side of the central portion. First and second contact elements are coupled to the first and second source/drain regions, respectively. A third contact element is coupled to the first end of the gate electrode, and a fourth contact element is coupled to the second end of the gate electrode. A fifth contact element is coupled to the semiconductor body region.

The p-channel NVM transistor is programmed as follows. A first program control voltage, typically a core supply voltage ($V_{CC}$), or an input/output supply voltage ($V_{DD}$) is applied to the first end of the gate electrode via the third contact element. A second program control voltage, typically a ground supply voltage, is applied to the second end of the gate electrode via the fourth contact element. As a result, a programming current flows through the gate electrode, thereby generating heat within the gate electrode.

A third program control voltage, typically an input/output supply voltage ($V_{DD}$), is applied to the body region of the transistor. The third program control voltage can be the same or greater than the first program control voltage. As a result, the p-channel NVM transistor is partially or fully negatively biased.

The threshold voltage of the p-channel NVM transistor is shifted in response to the locally generated heat and the negative bias condition. The agglomeration of the metal polysilicide in the gate electrode is an indication of the intense heat generated during programming. As a result, the programming operation is permanent.

The p-channel NVM transistor is read by applying a first read control voltage, typically the ground supply voltage, to the first and second ends of the gate electrode, and to the first source/drain region of the transistor. A second read control voltage, typically the core supply voltage ($V_{CC}$), is applied to the semiconductor body region and the second source/drain region of the transistor. If the NVM transistor has been programmed, no read current flows between the first and second source/drain regions. Conversely, if the NVM transistor has not been programmed, a significant read current flows between the first and second source/drain regions.

The present invention will be more fully understood in view of the following description and drawings.

DETAILED DESCRIPTION

The present invention provides a non-volatile memory (NVM) transistor that takes advantage of the threshold instability of a negatively biased p-channel transistor at a high temperature.

Figure 1:
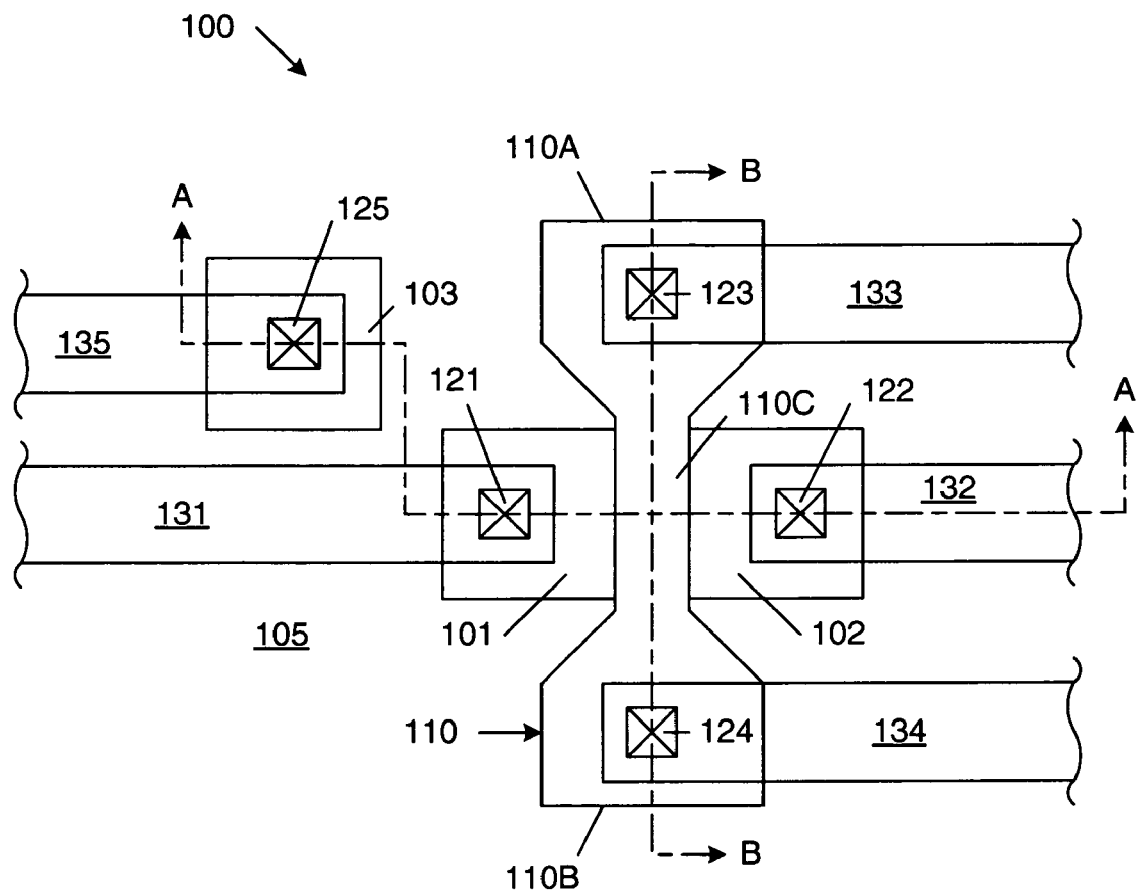
FIG. 1 is a layout diagram illustrating a five-terminal p-channel non-volatile memory transistor in accordance with one embodiment of the present invention.
Figure 2A:
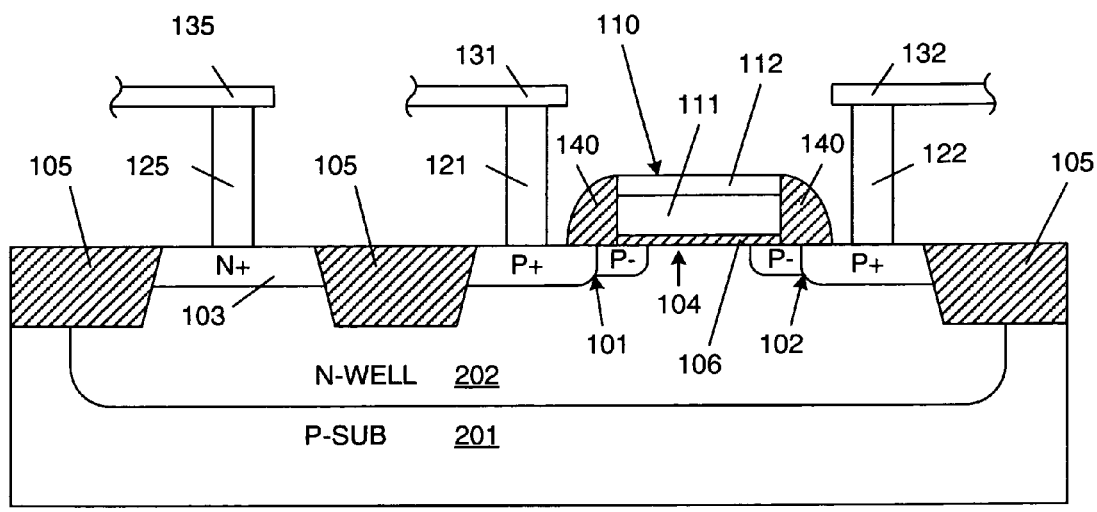
FIG. 2A is a cross sectional view of the p-channel non-volatile memory transistor along section line A—A of FIG. 1.
Figure 2B:
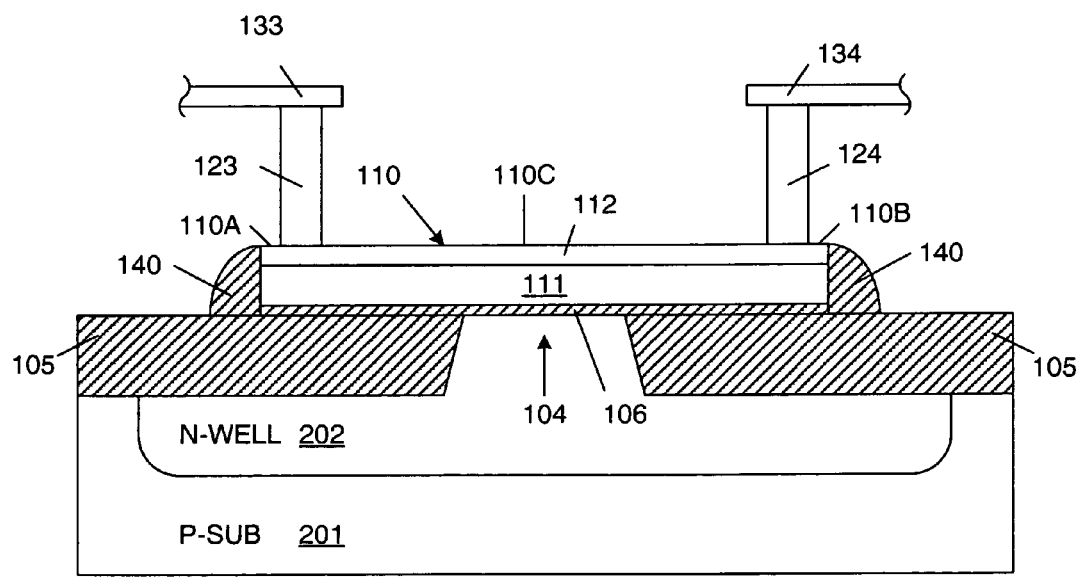
FIG. 2B is a cross sectional view of the p-channel non-volatile memory transistor along section line B—B of FIG. 1.

FIG. 1 is a layout diagram illustrating a five-terminal p-channel NVM transistor 100 in accordance with one embodiment of the present invention. FIG. 2A is a cross sectional view of p-channel NVM transistor 100 along section line A—A of FIG. 1. FIG. 2B is a cross sectional view of p-channel NVM transistor 100 along section line B—B of FIG. 1. As described in more detail below, p-channel NVM transistor 100 is controlled to operate as a non-volatile memory cell.

P-channel NVM transistor 100, which is fabricated in p-type substrate 201 and n-type well region 202, includes p-type source/drain regions 101–102, n-type well contact region 103, field dielectric region 105, gate electrode 110, electrically conductive contact elements 121–125, electrically conductive traces 131–135 and dielectric sidewall spacers 140. P-channel transistor 100 is fabricated using conventional CMOS processing techniques.

In the described embodiments, p-type substrate 201 is a monocrystalline semiconductor substrate (e.g., silicon). N-type well region 202 is formed in substrate 201 using conventional CMOS processing techniques (e.g., n-type ion implantation). Field dielectric region 105 is formed in the upper surface of n-type well region 202 as illustrated. In the illustrated embodiments, field dielectric region 105 is a shallow trench isolation (STI) region, which is created by forming a trench in substrate 201, and then filling the trench with a dielectric material, such as silicon oxide. However, in other embodiments, field dielectric region 105 can be formed by the local oxidation of silicon (LOCOS).

A gate dielectric layer 106 is formed over the upper surface of n-type well region 202. The gate dielectric layer 106 can be, for example, thermally grown silicon oxide having a thickness in the range of about 10 to 25 Angstroms. A conductively doped polycrystalline silicon (polysilicon) layer 111 is formed over the upper surface of the gate dielectric layer 106. In the described embodiment, polysilicon layer 111 has a thickness in the range of about 500 to 1500 Angstroms. In this embodiment polysilicon layer 111 is doped with boron to a dopant concentration in the range of about $10^{20}$ atoms/cm$^3$.

A layer of refractive metal polysilicide 112 is formed over the upper surface of polysilicon layer 111. In one embodiment, metal polysilicide layer 112 is formed by depositing a layer of refractive metal, such as titanium (Ti), nickel (Ni) or cobalt (Co), on polysilicon layer 111. A subsequent thermal anneal causes the refractive metal to react with the underlying polysilicon layer, thereby forming metal polysilicide layer 112. Alternately, a layer of metal polysilicide (TiSi or CoSi) can be deposited directly on polysilicon layer 111. In accordance with one embodiment, metal polysilicide layer 112 has a thickness in the range of about 1000 to 2000 Angstroms.

The metal polysilicide layer 112 and polysilicon layer 111 are patterned to form gate electrode 110. Gate electrode 110 includes a first end 110A dimensioned to receive a first contact element 123, a second end 110B dimensioned to receive a second contact element 124, and a central region 110C dimensioned to define a channel region 104 of p-channel NVM transistor 100. Lightly doped source/drain regions (P−) are formed in n-well region 202, wherein the edges of these P− regions are self-aligned with edges of gate electrode 110. Dielectric sidewall spacers 140 (e.g., silicon nitride, silicon oxide, or silicon oxynitride) are formed adjacent to gate electrode 110. Heavily doped source/drain contact regions (P+) are formed in n-well region 202, wherein the edges of these P+ regions are self-aligned with edges of sidewall spacers 140. The P+ and P− regions form p-type source/drain regions 101 and 102. In an alternate embodiment, lightly doped P− regions and sidewall spacers 140 can be eliminated. Heavily doped n-well contact region 103 (N+) is formed in n-well region 202, away from source/drain regions 101–102. In one embodiment, self-aligned metal polysilicide (i.e., salicide) can be formed over exposed upper surfaces of source/drain regions 101–102, n+ type contact region 103 and polysilicon layer 111, in a manner known to those of ordinary skill in the semiconductor processing art.

Electrically conductive contact elements 121, 122, 123, 124 and 125 are formed through a first dielectric layer (not shown), thereby contacting source/drain region 101, source/drain region 102, the first end 110A of gate electrode 110, the second end 110B of gate electrode 110, and n+ contact region 103, respectively. Contact element 123 (coupled to first end 110A) and contact element 124 (coupled to second end 110B) may be coupled to separate nodes in a circuit, thereby allowing for independent control of first end 110A and second end 110B of gate electrode 110. In the described embodiment, contact elements 121–125 are tungsten. However, other materials can be used to form contact elements 121–125 in other embodiments.

Electrically conductive traces 131–135, which are formed over the first dielectric layer, contact the contact elements 121–125, respectively. Although traces 131–135 are all illustrated as part of a first conductive layer (e.g., the first metal layer), it is understood that these traces may be located in different conductive layers in other embodiments, as required by the layout of the associated device.

In accordance with one embodiment, five-terminal p-channel NVM transistor 100 is controlled to operate as a non-volatile memory cell in the manner described below.

NVM transistor 100 is programmed by applying a first program control voltage to the first end 110A of gate electrode, a second program control voltage to the second end 110B of gate electrode 110, and a third program control voltage to the body/substrate (i.e., n-well 202) of NVM transistor 100. The first program control voltage is selected to be greater than the second program control voltage, such that a programming current flows through gate electrode 110, thereby generating localized heat. The third programming control voltage is selected to be greater than the second programming control voltage, such that p-channel NVM transistor 100 is negatively biased. The localized heat and negative bias causes an accelerated threshold voltage shift within p-channel NVM transistor 100.

In the present embodiment, p-channel NVM transistor 100 is programmed by applying a first positive supply voltage to the first end 110A of gate electrode 110, a second positive supply voltage to n-well 202, and a ground supply voltage to the second end 110B of gate electrode 110. The first positive supply voltage is a core supply voltage $V_{CC}$, which is typically used to operate the core logic of a CMOS device, or an input/output supply voltage $V_{DD}$, which is typically used to operate the input/output logic of a CMOS device. For example, core supply voltage $V_{CC}$ may have a nominal value of 1 Volt. The second positive supply voltage can be an input/output supply voltage $V_{DD}$, which is typically used to operate the input/output logic of a CMOS device. For example, input/output supply voltage $V_{DD}$ may have a nominal value of 2.5 or 3.3 Volts. Note that both supply voltages $V_{CC}$ and $V_{DD}$ are normal operating voltages of the CMOS device.

Under the above-described conditions, a current of about 10 to 20 milli-Amperes passes through gate electrode 110, thereby heating the polysilicon and metal polysilicide layers of gate electrode 110. Also under these conditions, the second end 110B of gate electrode 110 is negatively biased with respect to n-well region 202. The heat generated within gate electrode 110 and the negative bias voltage on this gate electrode 110 results in a bias temperature degradation effect on p-channel NVM transistor 100. In accordance with one embodiment, the programming operation is performed for a duration of about 100 microseconds to 100 milliseconds. During this time, gate electrode 110 reaches a temperature in the range of about 400° C. to 900° C. Under these conditions, the threshold voltage of transistor 100 shifts (i.e., becomes more negative), such that transistor 100 will not conduct current when a conventional read control voltage (e.g., 0 Volts) is applied to gate electrode 110. For example, the threshold voltage of p-channel transistor 100 may shift from a range of about −0.3 to −0.4 Volts, to a range of about −1.1 to −2.0 Volts. It is important to note that the programming operation permanently shifts the threshold voltage of p-channel transistor 100, such that this transistor operates as a non-volatile memory cell.

To read the programmed/non-programmed state of p-channel NVM transistor 100, a ground supply voltage (0 Volts) is applied to both ends 110A and 110B of gate electrode 110 and to source/drain terminal 102. The $V_{CC}$ supply voltage is applied to n-well region 202 and source/drain region 101. Current sense circuitry (not shown) is coupled to source/drain region 101. If NVM transistor 100 is programmed, the threshold voltage of this transistor is negative enough to prevent current from flowing between source/drain regions 101–102. Thus, the current sense circuitry fails to detect a significant read current when NVM transistor 100 is programmed. The current sense circuitry identifies the absence of read current as a first logic stage (e.g., a logic "1" value). Conversely, if NVM transistor 100 is not programmed, the threshold voltage of this transistor is less negative, thereby allowing a significant read current to flow between source/drain regions 101–102. Thus, the current sense circuitry detects a significant read current when NVM transistor 100 is not programmed. The current sense circuitry identifies the presence of a read current as a second logic state (e.g., a logic "0" value). In this manner, the current sense circuitry is able to identify the programmed/non-programmed state of p-channel NVM transistor 100. In the described embodiment, the duration of the read operation is comparable to the duration of a read operation of a conventional non-volatile memory cell, on the order of 1 microsecond.

P-channel NVM transistor 100 may be placed in an off (standby) state, wherein no current flows between source/drain regions 101–102, by applying the $V_{CC}$ supply voltage to gate electrode 110, source/drain region 101 and n-well region 202, and applying the ground supply voltage to source/drain region 102.

One advantage of p-channel NVM transistor 100 is that this transistor can be fabricated using a conventional CMOS process, without requiring any additional process steps or masks. In addition, NVM transistor 100 can be programmed without a high programming voltage (i.e., a voltage greater than the normal operating voltage of other transistors formed on the same substrate as transistor 100). NVM transistor 100 can advantageously be used in an application such as repairing bad circuitry (i.e., disabling faulty circuitry and enabling redundant circuitry). A plurality of NVM transistors identical to transistor 100 can be used to store an encryption key in a device for security applications. NVM transistor 100 has an advantage over conventional fuse-based NVM technology in an encryption key application. When using conventional fuse-based NVM technology, a visual inspection of the fuse-based elements may reveal the encryption key, because the physical characteristics of programmed and non-programmed fused-base NVM devices are different. However, the physical differences between the programmed and non-programmed NVM transistor 100 are subtle, thereby making it difficult to reverse engineer the contents of this NVM transistor 100.

Although the invention has been described in connection with several embodiments, it is understood that this invention is not limited to the embodiments disclosed, but is capable of various modifications, which would be apparent to one of ordinary skill in the art. For example, although a single p-channel NVM transistor has been described, it is understood that an array of these transistors can be created. Such an array could be used in any application where a non-volatile memory fabricated using a standard CMOS process would be desirable, for instance in a programmable read-only memory (PROM) or a programmable logic device (PLD). As another example, other types of transistors, such as n-type transistors, may be used in accordance with the present invention. Thus, the present invention is only limited by the following claims.

I claim:

1. A method of operating a transistor as a non-volatile memory cell, the method comprising:
applying a first program control voltage to a first end of a gate electrode of the transistor; and
applying a second program control voltage to a second end of the gate electrode of the transistor,
wherein the first and second program control voltages cause a current to flow through the gate electrode of the transistor, thereby changing a threshold voltage of the transistor as a result of agglomeration in the gate electrode.

2. The method of claim 1, wherein the first program control voltage is a positive supply voltage, and the second program control voltage is a ground supply voltage.

3. The method of claim 1, further comprising applying a third program control voltage to a body region of the transistor, wherein the third program control voltage, combined with the second program control voltage, introduces a negative bias to the transistor.

4. The method of claim 3, wherein the first program control voltage is a positive core supply voltage, the second program control voltage is a ground supply voltage, and the third program control voltage is a positive input/output supply voltage, which is greater than the positive core supply voltage.

5. The method of claim 1, further comprising:
applying a first read control voltage to the first and second ends of the gate electrode, and to a first source/drain region of the transistor; and
applying a second read control voltage to the body of the transistor and a second source/drain region of the transistor.

6. The method of claim 5, wherein the first read control voltage is a ground supply voltage and the second read control voltage is a positive supply voltage.

7. The method of claim 5, further comprising detecting whether a significant read current is present at the first source/drain region of the transistor.

8. The method of claim 7, further comprising:
responsive to the detecting, disabling faulty circuitry and enabling redundant circuitry.

9. The method of claim 7, wherein applying the first and second program control voltages stores a portion of an encryption key.

* * * * *